(12) United States Patent
Huang

(10) Patent No.: US 10,790,030 B1
(45) Date of Patent: Sep. 29, 2020

(54) NON-VOLATILE MEMORY DEVICE AND METHOD CAPABLE OF PAUSING AND RESUMING PROGRAMMING OPERATION

(71) Applicant: Winbond Electronics Corp., Taichung (TW)

(72) Inventor: Koying Huang, San Jose, CA (US)

(73) Assignee: Windbond Electronics Corp., Taichung (TW)

( * ) Notice: Subject to any disclaimer, the term of this patent is extended or adjusted under 35 U.S.C. 154(b) by 0 days.

(21) Appl. No.: 16/445,224

(22) Filed: Jun. 19, 2019

(51) Int. Cl.
*G11C 16/30* (2006.01)
*G11C 16/32* (2006.01)
*G11C 16/10* (2006.01)
*G11C 5/14* (2006.01)

(52) U.S. Cl.
CPC .............. *G11C 16/30* (2013.01); *G11C 5/145* (2013.01); *G11C 16/10* (2013.01); *G11C 16/32* (2013.01)

(58) Field of Classification Search
CPC ................................ G11C 16/30; G11C 5/145
See application file for complete search history.

(56) References Cited

U.S. PATENT DOCUMENTS

| | | | |
|---|---|---|---|
| 8,897,085 B2 | 11/2014 | Li | |
| 2001/0045569 A1* | 11/2001 | Imamiya | G11C 5/143 257/200 |
| 2006/0087888 A1* | 4/2006 | Jeong | G11C 16/102 365/185.28 |
| 2008/0136501 A1 | 6/2008 | Suzuki | |
| 2018/0166130 A1* | 6/2018 | Intrater | G11C 13/004 |

FOREIGN PATENT DOCUMENTS

| | | |
|---|---|---|
| CN | 101615844 | 12/2009 |
| TW | I557748 | 11/2016 |

* cited by examiner

*Primary Examiner* — Jay W. Radke
(74) *Attorney, Agent, or Firm* — JCIPRNET

(57) ABSTRACT

A non-volatile memory device and a method thereof that are capable of improving programming speed are introduced. The non-volatile memory device includes a memory array, a charge-pump circuit, a bias detection circuit and a memory controller is introduced. The memory array includes a plurality of memory cells; and a charge-pump circuit is configured to generate a charge-pump voltage. The bias detection circuit is coupled to the charge-pump circuit and is configured to determine whether a level of the charge-pump voltage is less than a first pre-determined threshold value. The memory controller is coupled to the bias detection circuit and is configured to pause a programming operation being performed on at least one of the plurality of memory cells when the bias detection circuit determines that the level of the charge-pump voltage is less than the first pre-determined threshold value.

15 Claims, 4 Drawing Sheets

NON-VOLATILE MEMORY DEVICE AND METHOD CAPABLE OF PAUSING AND RESUMING PROGRAMMING OPERATION

BACKGROUND OF THE INVENTION

1. Field of the Invention

The invention relates to a memory device, and particularly relates to a non-volatile memory device and a method thereof that are capable of improving programming speed and saving power consumption of a programing operation performed on the non-volatile memory device.

2. Description of Related Art

Non-volatile memory devices are used as a storage device in electronic devices such as a computer, digital camera, smartphone in a wide range of applications. To write data into memory cells of the non-volatile memory device, a programming operation is performed by applying programming pulses to the memory cells. The programming operation to the memory cells consumes high power. Furthermore, programming speed of the programming operation depends on charge pump capability of a charge-pump circuit. If the charge-pump circuit is unable to provide sufficient power for a minimum programming bias, the programming operation is stopped and the pumped electric charges are lost. As a result, the programming speed may be very slow, and the power for dropped stopped programming operation is wasted.

Along with the popularity of non-volatile memory device, demands for a faster and more energy saving memory device is desirable.

This invention introduces a non-volatile memory device and a method thereof that are capable of improving programming speed and saving power consumption.

The non-volatile memory device includes a memory array, a charge-pump circuit, a bias detection circuit and a memory controller. The memory array includes a plurality of memory cells; and a charge-pump circuit is configured to generate a charge-pump voltage. The bias detection circuit is coupled to the charge-pump circuit and is configured to determine whether a level of the charge-pump voltage is less than a first pre-determined threshold value. The memory controller is coupled to the bias detection circuit and is configured to pause a programming operation being performed on at least one of the plurality of memory cells when the bias detection circuit determines that the level of the charge-pump voltage is less than the first pre-determined threshold value.

The method includes steps of generating a charge-pump voltage and performing a programming operation according to the charge-pump voltage; determining whether a level of the charge-pump voltage is less than a first pre-determined threshold value; continuing the programming operation when the level of the charge-pump voltage is not less than the first pre-determined threshold value; and pausing the programming operation when the level of the charge-pump voltage is less than the first pre-determined threshold value.

In embodiments of the invention, a programming operation being performed on a memory cell is paused and the electric charges are reserved when the level of the charge-pump voltage is less than a first pre-determined threshold value. When the level of the charge-pump voltage recovers to be greater than or equal to a second pre-determined threshold value, the programming operation is resumed and the reserved electric charges are supplied to the programming operation. In this way, an overall programming speed to the non-volatile memory device is improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
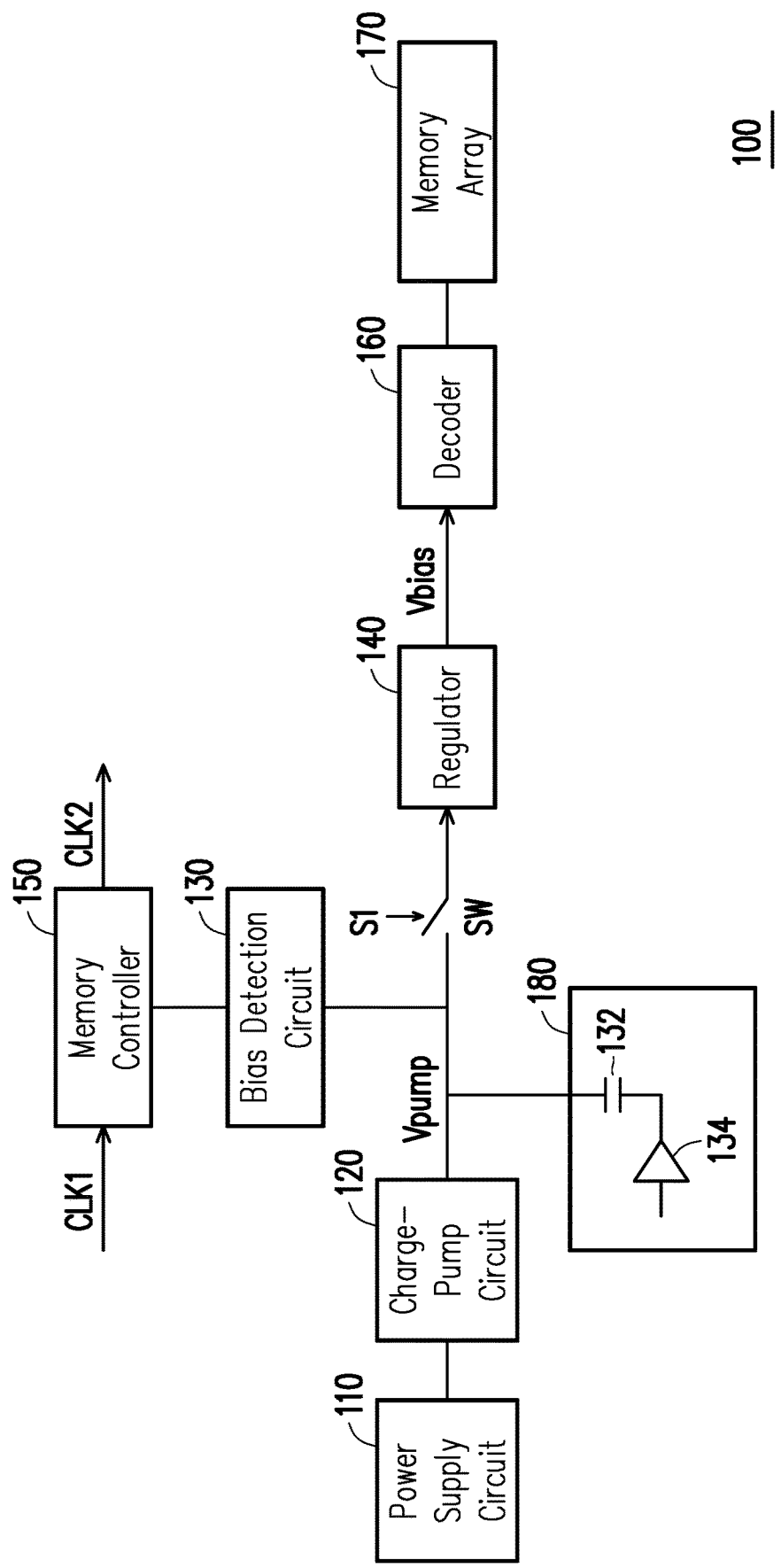
FIG. 1 is a schematic diagram illustrating a non-volatile memory device in accordance with an embodiment of the disclosure.

Referring to FIG. 1, a non-volatile memory device 100 includes a power supply circuit 110, a charge-pump circuit 120, a bias detection circuit 130, a regulator 140, a memory controller 150, a decoder 160, a memory array 170 and a charge reserve circuit 180. The memory array 170 may include a plurality of memory cells arranged in an array. In an embodiment, the memory array 170 is a flash memory array that includes a plurality flash memory cells. The memory array 170 may be a NAND memory array or NOR memory array or any other type of memory array.

The power supply circuit 110 is configured to generate a supply power (e.g., a supply voltage or a supply current) and provide the generated supply power to circuits of the non-volatile memory device 100. In an embodiment, the power supply circuit 110 may provide a supply voltage to the charge-pump circuit 120.

The charge-pump circuit 120 is configured to generate a charge-pump voltage Vpump according to the supply voltage provided by the power supply circuit 110. The generated charge-pump voltage Vpump is provided for different operations of the non-volatile memory device 100 such as a programming operation or an erasing operation. A level of the charge-pump voltage Vpump may be higher or lower than a level of the supply voltage, and the level of the charge-pump voltage Vpump may be varied during operation of the non-volatile memory device 100. In an embodiment, the level of the charge-pump voltage Vpump may vary according to a variation of the supply voltage provided by the power supply circuit 110. In other words, a charge pump capability of the charge-pump circuit 120 depends on the level of the supply voltage.

The bias detection circuit 130 is configured to detect a level of the charge-pump voltage Vpump and to compare the level of the charge-pump voltage with pre-determined threshold values. The bias detection circuit 130 may determine whether the level of the charge-pump voltage Vpump is less than a first pre-determined threshold value. A detection result of the bias detection circuit 130 is provided to the memory controller 150, and the memory controller 150 controls an operation of the non-volatile memory device 100 according to the detection result provided by the bias detection circuit 130. In some embodiments, the first pre-determined threshold value is the minimum voltage level for the charge-pump voltage Vpump required for the programming operation. In other words, if the level of the charge-pump voltage Vpump is less than the first pre-determined threshold value, the programming operation may be delayed, suspended or failed if no further action is performed.

In an embodiment, when the memory controller 150 is performing a programming operation to memory cells of the memory array 170 and the bias detection circuit 130 determines that the level of the charge-pump voltage Vpump is less than the first pre-determined threshold value, the memory controller 150 is configured to pause the programming operation to the memory cells of the memory array 170. Otherwise, when the level of the charge-pump voltage Vpump is not less than the first pre-determined threshold value, the memory controller 150 is configured to continue the programming operation to the memory cells. In an embodiment, when the bias detection circuit 130 determines that the charge-pump voltage Vpump is recovered to a level greater than or equal to a second pre-determined threshold value, the memory controller 150 is configured to resume the paused programming operation. The second pre-determined threshold value is greater than the first pre-determined threshold value.

In other words, the programming operation is paused when the level of the charge-pump voltage Vpump is less than the first pre-determined threshold value, and the paused programming operation is resumed when the level of the charge-pump voltage Vpump recovers to be greater than or equal to the second pre-determined threshold value.

In an embodiment, the memory controller 150 may receive a clock signal CLK1 from a clock generator (not shown), and is configured to control operations of the non-volatile memory device 100 according to the clock signal CLK2. In an embodiment, the memory controller 150 is further configured to generate the clock signal CLK2 based on the clock signal CLK1 according to the detection result of the bias detection circuit 130. The clock signal CLK2 may be used to control some operations such as a programming operation of the non-volatile memory device 100.

In an embodiment, during a programming period of the programming operation, when the detection result of the bias detection circuit 130 indicates that the level of the charge-pump voltage Vpump is less than the first pre-determined threshold, the memory controller 150 stops the clock signal CLK2, thereby pausing the programming operation to the memory cells of the memory array 170. When the detection result of the bias detection circuit 130 indicates that the level of the charge-pump voltage Vpump has recovered to be greater than or equal to the second pre-determined threshold value, the memory controller 150 resumes the clock signal CLK2, thereby resuming the paused programming operation. In an embodiment, the clock signal CLK2 is substantially same as the clock signal CLK1 when the programming operation is not paused, and the clock signal CLK2 is stopped when the programming operation is paused.

In an embodiment, the non-volatile memory device 100 further includes a switch SW coupled between the charge-pump circuit 120 and the regulator 140. The switch SW is controlled by a control terminal S1 which may be generated by the memory controller 150. During the pausing period of the programming operation to the memory cell, the memory controller 150 is further configured to turn off the switch SW1 to avoid the charge-pump voltage Vpump passing through the regulator 140 to a drain terminal of the memory cell. In this way, Vpump or the power is not leaked through the drain terminal of the memory cell, thereby saving the power consumption of the programming operation.

The charge reserve circuit 180 is configured to reserve electric charges during the pausing period of a paused programming operation and to supply the reserved electric charges for a resumed programming operation. In an embodiment, the charge reserve circuit 130 include a boost capacitor 132 and an operational amplifier 134, wherein a one terminal of the boost capacitor 132 is coupled to output of the charge-pump circuit 120 to receive the charge-pump voltage Vpump, and another end of the boost capacitor 132 is coupled to the operational amplifier.

The operational amplifier 134 is configured to control the voltage level at a connection node between the capacitor and the operation amplifier 134. In an embodiment, the operational amplifier 134 is configured to set the connection node between the boost capacitor 132 and the operational amplifier 134 to ground voltage level (e.g., zero volts) during the pausing period of the programming operation. In this way, the electric charges are reserved in the charge reserve circuit 130. During a normal programming operation, the operational amplifier 134 may set a pre-defined voltage level to the connection node between the boost capacitor 132 and the operational amplifier 134.

The regulator 140 (also known as voltage regulator) is coupled to the charge-pump circuit 120 and is configured to regulate the charge-pump voltage Vpump to generate a bias voltage Vbias. In an embodiment, the regulator 140 is configured to maintain a voltage level of the bias voltage Vbias at a target level. The bias voltage Vbias is provided to the decoder 160 so as to perform an operation (e.g., programming operation) to the memory cells of the memory array 170.

Figure 2:
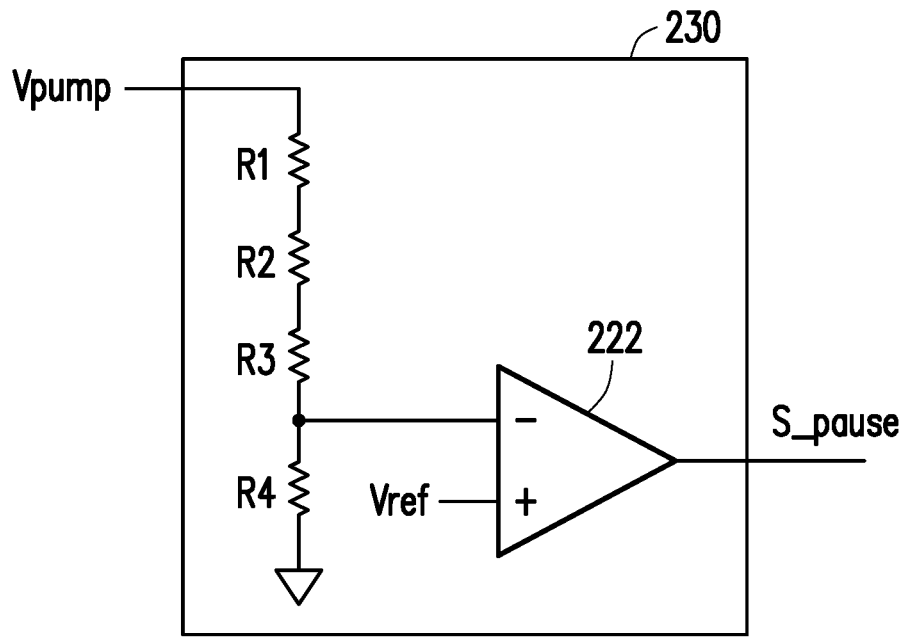
FIG. 2 is a schematic diagram illustrating a bias detection circuit of a non-volatile memory device in accordance with an embodiment of the disclosure.

Referring to FIG. 2, a bias detection circuit 230 in accordance with an embodiment of the disclosure is illustrated. The bias detection circuit 230 may include a comparator 222 and a resistor string including resistors R1 through R4. One end of the resistor string is coupled to receive the charge-pump voltage Vpump and another one end of the resistor string receives to a reference voltage. The reference voltage could be a voltage with a ground voltage level or any other voltage level that is determined according to designed needs. A number of the resistors included in the resistors string and the values of each of the resistors R1 through R4 in the resistor string are determined according to designed needs and are not limited in the disclosure.

The comparator 222 has a first input terminal, a second input terminal and an output terminal. The first input terminal of the comparator 222 is coupled to a node of the resistor string; and the second input terminal of the comparator 222 is coupled to a reference voltage Vref. For example, the first input terminal of the comparator 222 is coupled to a node between the resistors R3 and R4 of the resistor string. The comparator 222 is configured to compare voltages received from the first and second input terminals of the comparator 222, and to output a detection result S_pause at the output terminal of the comparator 222. In an example, when the voltage level from the node between the resistors R3 and R4 is less than the voltage level of the reference voltage Vref, the comparator 222 outputs a positive pause on the detection result S_pause. When a positive pause is detected in the detection result S_pause, it indicates that the level of the charge-pump voltage Vpump is less than the first pre-determined threshold value. It should be noted that the structure and components included in the bias detection circuit 230 may be changed according to designed needs; and any circuit that has a function of determining whether a level of a charge-pump voltage is less than a pre-determined threshold value falls within the scope of the disclosure.

Figure 3:
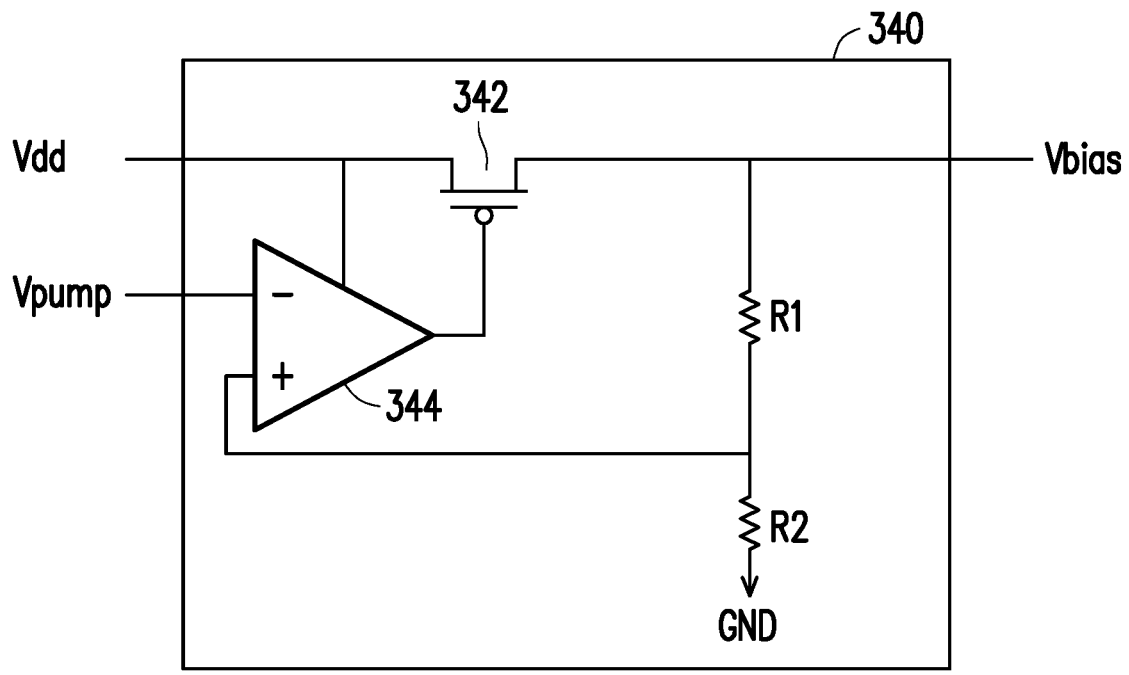
FIG. 3 is a schematic diagram illustrating a regulator of a non-volatile memory device in accordance with an embodiment of the disclosure.

Referring to FIG. 3, a regulator 340 in accordance with an embodiment of the disclosure is illustrated. The regulator 340 may include an input terminal that receive the charge-pump voltage Vpump, an output terminal that outputs the bias voltage Vbias, a switch 342, an operational amplifier 344 and resistors R1 and R2. The resistor R1 is connect to the resistor R2; and the resistors R1 and R2 are coupled between the output terminal of the regulator 340 and a reference node (e.g., GND). The operational amplifier 344 has an inverting input terminal, a non-inverting input terminal and an output terminal, where the inverting input terminal receives the charge-pump voltage; the non-inverting input terminal is coupled to a connection node between the resistors R1 and R2; and the output terminal is coupled to a control terminal of the switch 342. The switch 342 further includes a first terminal and a second terminal which are coupled to a reference voltage (e.g., Vdd) and the output terminal of the regulator 340, respectively. The regulator 340 may output the bias voltage Vbias according to the values of the resistors R1, R2 and the charge-pump voltage Vpump. For example, the bias voltage Vbias may be calculated according to equation Vbias=Vpump*R1/R2, but the disclosure is not limited thereto. In an embodiment, the switch 342 is a p-type transistor, but the disclosure is not limited thereto. It should be noted that the structure and components included in the regulator 340 may be changed according to designed needs; and any circuit that has a function of regulating a charge-pump voltage falls within the scope of the disclosure.

Figure 4:
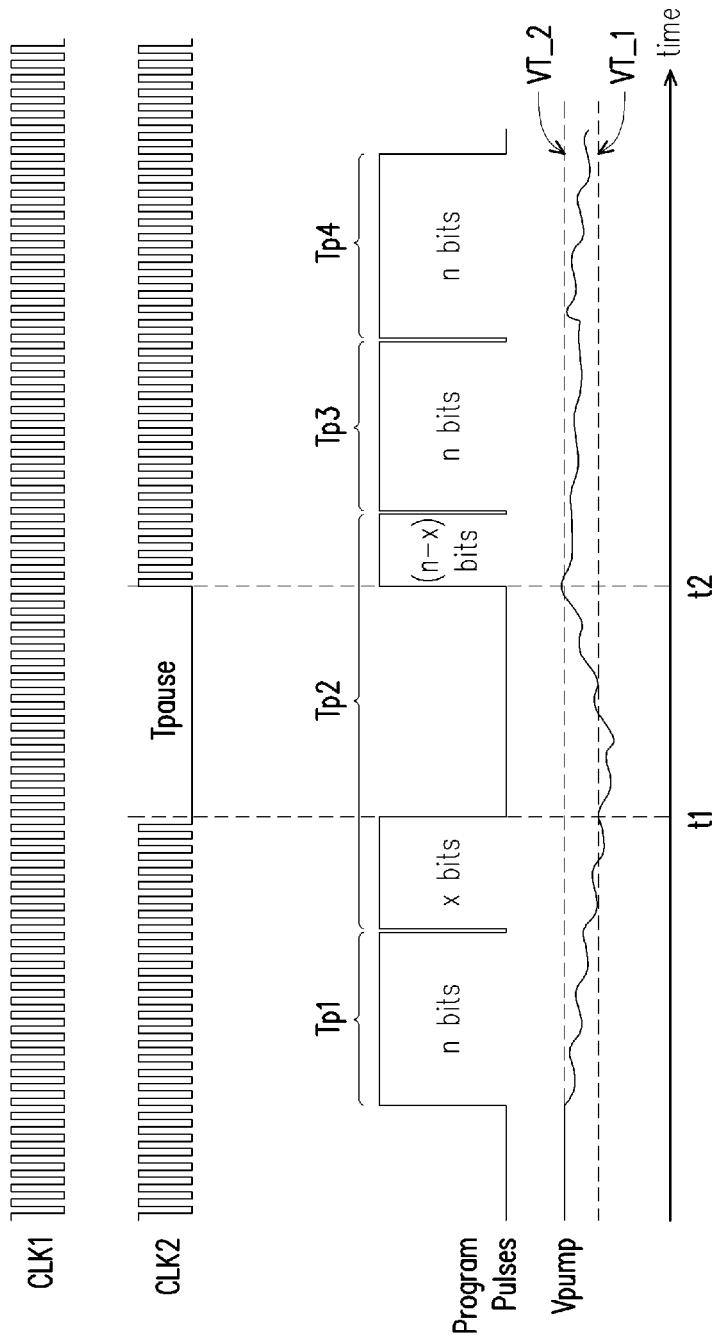
FIG. 4 illustrates exemplary signals of a non-volatile memory device in accordance with an embodiment of the disclosure.

Referring to FIG. 4, exemplary signals of a non-volatile memory device in accordance with an embodiment of the disclosure are illustrated. Referring to FIG. 1 and FIG. 4, the clock signal CLK1 may be generated by a clock generator (not shown). The memory controller 150 may generate the clock signal CLK2 based on the clock signal CLK1 according to a detection result of the bias detection circuit 130. The bias detection circuit 130 may compare the charge-pump voltage Vpump with the threshold values VT_1 (also referred to as the first pre-determined threshold value) and VT_2 (also referred to as the second pre-determined threshold value).

When the level of the charge-pump voltage Vpump is less than the threshold value VT_1, the programming operation that is being performed to memory cells of the memory array is paused. In other words, when it determines that the charge-pump voltage is not enough to perform the programming operation properly, the programming operation is temporarily paused. As shown in FIG. 4, at the time point t1, it determines that the level of the charge-pump voltage Vpump is less than the threshold value VT_1, thus the programming operation is paused from the time point t1 until the level of the charge-pump voltage Vpump is recovered to be greater than or equal to the threshold value VT_2. At the time point t2, when the level of the charge-pump voltage Vpump is recovered to be greater than or equal to the threshold value VT_2, the paused programming operation is resumed, and the time period from t1 to t2 is called a pausing period Tpause. During the pausing period Tpause, the clock signal CLK2 is stopped and no programming pulse is applied to the memory cells. During non-pausing period of the programming operation, the clock signal CLK2 are supplied and the programming pulses are applied to the memory cells.

As shown in FIG. 4, n bits of data are programmed to memory cells of the memory array (e.g., memory array 170) in each of the periods Tp1, Tp2, Tp3 and Tp4, wherein n is a natural number such as 8-bits, 16-bits, 32-bits, but the value of n is not limited thereto. The period Tp2 includes the pausing period Tpause, thus during the period Tp2, a part (e.g., x bits) of n bits may be programmed before the pausing period Tpause and the remaining parts (e.g., n-x bits) of the n bits are performed after the pausing period Tpause, where x is positive integer.

Figure 5:
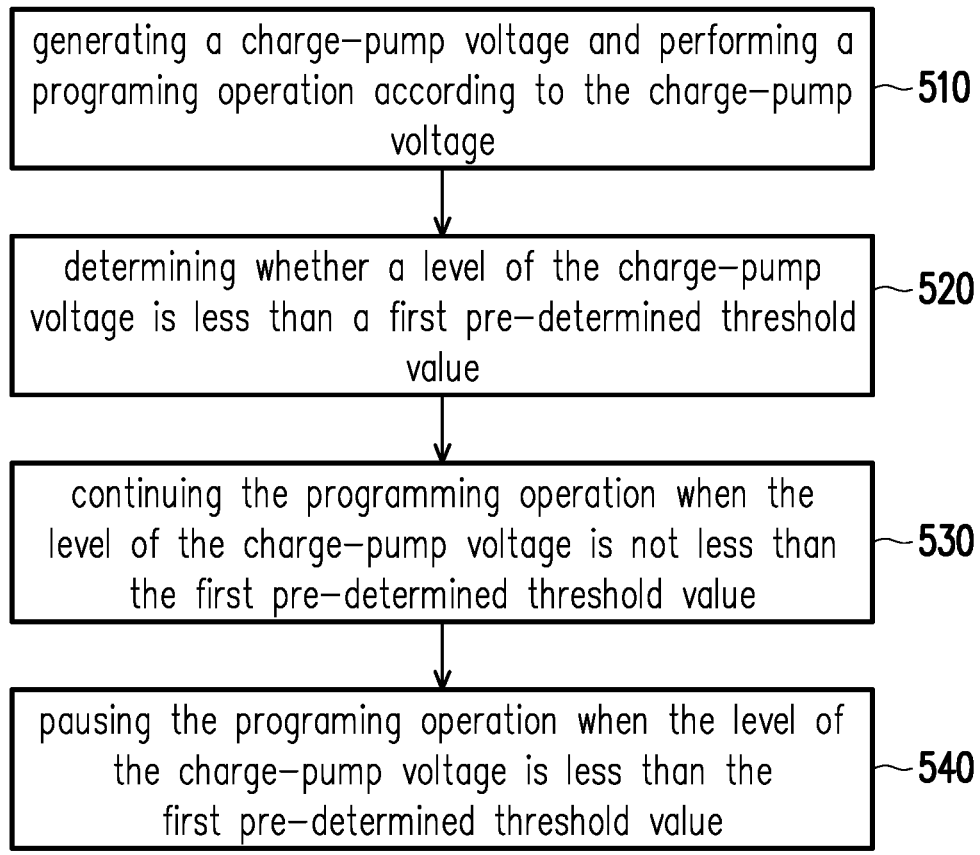
FIG. 5 is a flowchart diagram illustrating a method adapted to a non-volatile memory device in accordance with an embodiment of the disclosure.

Referring to FIG. 5, flowchart diagram illustrating a method adapted to a non-volatile memory device in accordance with an embodiment of the disclosure is illustrated. In step 510, a charge-pump voltage is generated and a programming operation is performed according to the charge-pump voltage. In step 520, it determines whether a level of the charge-pump voltage is less than a first pre-determined threshold value. In step 530, the programming operation is continued when the level of the charge-pump voltage is not less than the first pre-determined threshold value. In step 540, the programming operation is paused when the level of the charge-pump voltage is less than first the pre-determined threshold value. In an embodiment, the paused programming operation may be resumed when it determined that the level of the charge-pump voltage has recovered to be greater than or equal to a second pre-determined threshold value.

In summary, the embodiments of the disclosure introduce a non-volatile memory device and a method thereof that are capable of improving programming speed and saving power consumption. It may pause a programming operation being performed to the memory cells when determining that a level of a charge-pump voltage is less than a first pre-determined threshold value. The programming operation may be paused in a pausing period by stopping a clock signal provided to control the programming operation. In addition, electrical charges supplied to the programming operation may be reserved and the switch SW is turned off during the pausing period. As such, the power consumption for the programming operation is reduced. The paused programming operation may be resumed when the level of the charge-pump voltage is greater than or equal to a second pre-determined threshold value. The reserved electric charges during the pausing period may be supplied to the resumed programming operation. As such, the overall programming speed of the programming operation is improved, and the power consumption to the programing operation is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory device, comprising:
   a memory array, comprising a plurality of memory cells;
   a charge-pump circuit, configured to generate a charge-pump voltage; and
   a bias detection circuit, coupled to the charge-pump circuit and configured to determine whether a level of the charge-pump voltage is less than a first pre-determined threshold value; and
   a memory controller, coupled to the bias detection circuit, configured to pause a programming operation being performed on at least one of the plurality of memory cells when the bias detection circuit determines that the level of the charge-pump voltage is less than the first pre-determined threshold value,
   wherein when the bias detection circuit determines that the level of the charge-pump voltage is not less than a second pre-determined threshold value and the programming operation is being paused, the memory controller is further configured to resume the programming operation.

2. The non-volatile memory device of claim 1, wherein the programming operation is performed according a first clock signal, and
   the memory controller is configured to generate a second clock signal based on the first clock signal according to a detection result of the bias detection circuit, and to pause or resume the programming operation based on the second clock signal.

3. The non-volatile memory device of claim 2, wherein the programming operation is paused during a pausing period, and
   the memory controller is configured to stop the second clock signal during the pausing period.

4. The non-volatile memory device of claim 3, further comprising:
   a switch, coupled to the charge-pump circuit, wherein when the programming operation on a memory cell is paused, the memory controller is further configured to turn off the switch to avoid the charge-pump voltage passing to a drain terminal of the memory cell.

5. The non-volatile memory device of claim 1, further comprising:
   a charge-reserve circuit, coupled to the charge-pump circuit and configured to reserve electric charges of the programming operation when the programming operation is paused.

6. The non-volatile memory device of claim 5, wherein the electric charges reserved in the charge-reserve circuit are supplied to an output of the charge-pump circuit when the programming operation is resumed.

7. The non-volatile memory device of claim 5, wherein the charge-reserve circuit comprises a capacitor that is configured to store the electric charges during a pausing period of the programming operation.

8. The non-volatile memory device of claim 7, wherein the capacitor includes a first terminal and a second terminal, wherein the first terminal of the capacitor is coupled to the output of the charge-pump circuit, and the second terminal of the capacitor is coupled to a ground level during a programing pausing period of the programming operation.

9. The non-volatile memory device of claim 1, wherein the bias detection circuit comprising:
   a resistor string, wherein an end of the resistor string receives the charge-pump voltage and another end of the resistor string receives a first reference voltage; and
   a comparator, comprising a first input terminal, a second input terminal and an output terminal, wherein the first input terminal is coupled to a node of the resistor string, the second input terminal receive a second reference voltage, and the output terminal of the comparator outputs a detection result of the bias detection circuit.

10. The non-volatile memory device of claim 1, further comprising:
    a regulator, coupled to the charge-pump circuit and configured to regulate the charge-pump voltage to generate a bias voltage, wherein the bias voltage is used in the programming operation.

11. The non-volatile memory device of claim 10, wherein the regulator comprises:
    an input terminal, configured to receive the charge-pump voltage;
    an output terminal, configured to output the bias voltage;
    a resistor string, coupled between the output terminal of the regulator and a reference node;
    an operational amplifier, comprising an inverting terminal that receives the charge-pump voltage and a non-inverting terminal that is coupled to a node of the resistor string; and
    a switch, coupled between the input terminal and the output terminal of the regulator, wherein a control terminal of the switch is coupled to an output terminal of the operational amplifier.

12. A method, adapted to a non-volatile memory device, comprising:
    generating a charge-pump voltage and performing a programming operation according to the charge-pump voltage;
    determining whether a level of the charge-pump voltage is less than a first pre-determined threshold value;
    continuing the programming operation when the level of the charge-pump voltage is not less than the first pre-determined threshold value;
    pausing the programming operation during a pausing period of the programming operation when the level of the charge-pump voltage is less than the first pre-determined threshold value,
    wherein the programming operation is performed according to a clock signal, and the clock signal is stopped during the pausing period of the programming operation.

13. The method of claim 12, further comprising:
    resuming the programming operation when the level of the charge-pump voltage is not less than a second pre-determined threshold value and the programming operation is being paused.

14. The method of claim 13, further comprising:
    reserving electric charges of the programming operation when the programming operation is paused; and
    supplying the reserved electric charges when the programming operation is resumed.

15. The method of claim 12, further comprising:
    turning off a switch to avoid the charge-pump voltage passing to a drain terminal of a memory cell when the programming operation on the memory cell is paused.

* * * * *

UNITED STATES PATENT AND TRADEMARK OFFICE
CERTIFICATE OF CORRECTION

| | | |
|---|---|---|
| PATENT NO. | : 10,790,030 B1 | Page 1 of 1 |
| APPLICATION NO. | : 16/445224 | |
| DATED | : September 29, 2020 | |
| INVENTOR(S) | : Koying Huang | |

It is certified that error appears in the above-identified patent and that said Letters Patent is hereby corrected as shown below:

On the Title Page

Item (73) Assignee should be corrected to read:
Winbond Electronics Corp., Taichung City (TW)

Signed and Sealed this
Eighth Day of December, 2020

Andrei Iancu
*Director of the United States Patent and Trademark Office*